(12) United States Patent
Fenstermaker et al.

(10) Patent No.: US 7,129,749 B1
(45) Date of Patent: Oct. 31, 2006

(54) PROGRAMMABLE LOGIC DEVICE HAVING A CONFIGURABLE DRAM WITH TRANSPARENT REFRESH

(75) Inventors: Larry R. Fenstermaker, Nazareth, PA (US); John A. Schadt, Bethlehem, PA (US); Mou C. Lin, High Bridge, NJ (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 69 days.

(21) Appl. No.: 10/974,305

(22) Filed: Oct. 27, 2004

(51) Int. Cl.
*H03K 19/177* (2006.01)

(52) U.S. Cl. .......................................... 326/41; 326/82

(58) Field of Classification Search ............ 326/37–41, 326/26, 27, 30, 82, 83; 365/233, 206
See application file for complete search history.

(56) References Cited

U.S. PATENT DOCUMENTS

| | | | |
|---|---|---|---|
| 5,206,830 A | 4/1993 | Isobe et al. | 365/194 |
| 5,317,212 A | 5/1994 | Wahlstrom | 307/465 |
| 5,375,086 A | 12/1994 | Wahlstrom | 365/149 |
| 5,594,698 A * | 1/1997 | Freeman | 365/222 |
| 5,617,551 A | 4/1997 | Corder | 395/401 |
| 6,088,260 A * | 7/2000 | Choi | 365/182 |
| 6,600,677 B1 | 7/2003 | Afghahi et al. | 365/187 |
| 6,717,863 B1 | 4/2004 | Afghahi et al. | 365/189.04 |
| 6,778,461 B1 | 8/2004 | Grasso | 365/230.03 |

* cited by examiner

*Primary Examiner*—Don Le
(74) *Attorney, Agent, or Firm*—Steve Mendelsohn; Yuri Gruzdkov (57) ABSTRACT

A programmable logic device (PLD) having a programmable routing structure that employs non-static memory cells, such as dynamic random access memory (DRAM) cells, to control configurable circuit elements, such as pass-transistors and/or MUXes. In a representative embodiment, each DRAM cell is connected to its corresponding configurable circuit element using a buffer adapted to stabilize the output voltage generated by the cell and offset the effect of charge leakage from the cell capacitor. In addition, refresh circuitry associated with the DRAM cell periodically restores the charge in the cell capacitor using a refresh operation that is performed in the background, without disturbing the user functions of the PLD. Advantageously, a relatively large capacitance associated with a DRAM cell makes a PLD of the invention less susceptible to soft errors than a prior-art PLD that relies on SRAM cells for configuration control of its routing structure.

19 Claims, 5 Drawing Sheets

PROGRAMMABLE LOGIC DEVICE HAVING A CONFIGURABLE DRAM WITH TRANSPARENT REFRESH

TECHNICAL FIELD

The present invention relates to programmable logic devices (PLDs), such as field-programmable gate arrays (FPGAs), and, more specifically, to configuration memory for such devices.

BACKGROUND

An FPGA is a programmable logic device having an array of configurable logic blocks (CLBs) connected together via a programmable routing structure. A typical FPGA may have tens of thousands of CLBs, each CLB having a plurality of primitive logic cells such as AND gates, lookup tables, registers, etc. The CLBs may be interconnected in a variety of ways to implement a desired logic function.

Figure 1:
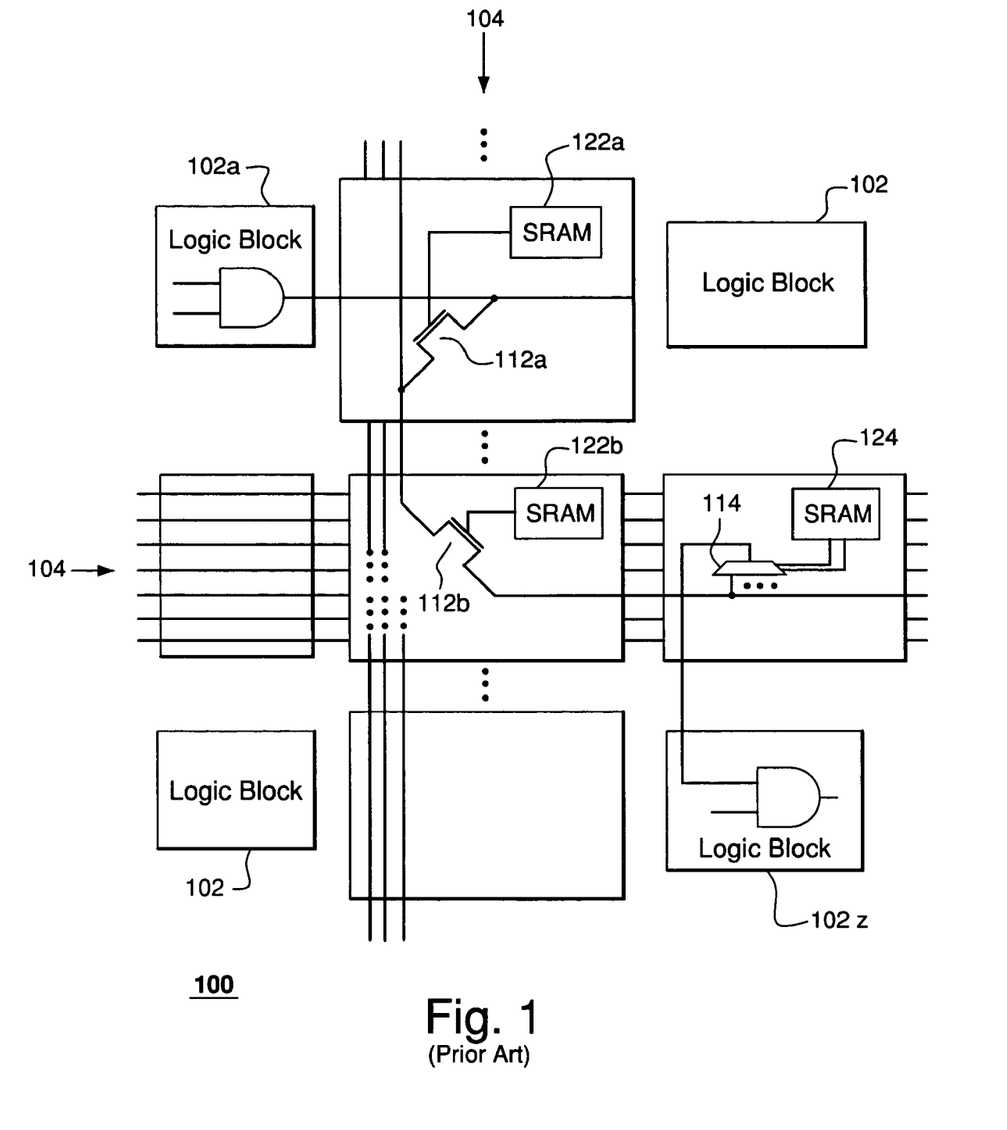
FIG. 1 schematically shows a prior-art FPGA having SRAM blocks.

FIG. 1 schematically shows a portion of an FPGA 100 having a plurality of CLBs 102 interconnected through a routing structure 104. Routing structure 104 is programmed to provide desired connections between CLBs 102 using configurable circuit elements, e.g., pass-transistors and/or multiplexers (MUXes), that are variously coupled between different transmission lines of the routing structure. Each configurable circuit element of routing structure 104 is controlled by a corresponding static random-access memory (SRAM) block (having one or more memory cells) such that desired connections in FPGA 100 are achieved by writing appropriate data into the SRAM blocks.

For example, FIG. 1 illustratively shows a programmable connection between an AND gate in CLB 102a and an AND gate in CLB 102z implemented using two pass-transistors 112a and 112b and a MUX 114. The gate nodes of pass-transistors 112a and 112b are controlled by an SRAM cell in an SRAM block 122a and an SRAM cell in an SRAM block 122b, respectively, and the one or more select lines of MUX 114 are controlled by one or more SRAM cells in an SRAM block 124. When the corresponding cell in SRAM block 122 has a binary "one", the associated pass-transistor 112 is turned into an "on" state, thereby electrically connecting the transmission lines of routing structure 104 coupled to the source and drain of that pass-transistor. Alternatively, when that SRAM cell has a binary "zero", pass-transistor 112 is turned into an "off" state, thereby electrically isolating those lines. Similarly, when the one or more cells in SRAM block 124 have a specific appropriate binary value, MUX 114 selects its input line connected to pass-transistor 112b, thereby electrically connecting that pass-transistor to the AND gate in CLB 102z. Alternatively, when SRAM block 124 has a different binary value, MUX 114 selects a different input line, thereby electrically isolating that pass-transistor from the AND gate.

Each memory cell in SRAM blocks 122 and 124 typically has four or six transistors arranged to form a bistable circuit, wherein one circuit state corresponds to the binary "one" and the other circuit state corresponds to the binary "zero". For reliable operation of FPGA 100, the data stored in SRAM blocks 122 and 124 need to remain unchanged after the FPGA has been programmed because, as shown above, changes in the stored data may alter connections between the CLBs. These changes, in turn, might cause functional/processing errors in FPGA 100.

It is known that alpha particles present in ambient cosmic rays can cause a memory cell of an SRAM block to change its state upon a particle strike. This effect is known as a "soft error." The problem of soft errors becomes more pronounced as the transistor size, with which FPGA circuit elements are implemented, decreases. For example, one of the contributing factors is that a relatively small capacitive charge of a relatively small transistor makes the transistor more susceptible to a state change due to the effect of the electrical charge generated in the alpha-particle wake. A representative prior-art solution to soft errors is to carry out frequent memory reads to detect and correct state changes. However, disadvantageously, frequent reading of SRAM blocks reduces the voltage level of internal nodes and slows down the general speed of the FPGA operation.

SUMMARY

The problems in the prior art are addressed, in accordance with the principles of the present invention, by a programmable logic device (PLD) having a programmable routing structure that employs non-static memory cells, such as dynamic random access memory (DRAM) cells, to control configurable circuit elements, such as pass-transistors and/or MUXes. In a representative embodiment, each DRAM cell is connected to its corresponding configurable circuit element using a buffer adapted to stabilize the output voltage generated by the cell and offset the effect of charge leakage from the cell capacitor. In addition, refresh circuitry associated with the DRAM cell periodically restores the charge in the cell capacitor using a refresh operation that is performed in the background, without disturbing the user functions of the PLD. Advantageously, a relatively large capacitance associated with a DRAM cell makes a PLD of the invention less susceptible to soft errors than a prior-art PLD that relies on SRAM cells for configuration control of its routing structure.

According to one embodiment, the present invention is a programmable logic device (PLD), comprising a plurality of configurable logic blocks (CLBs) inter-connectable through a programmable routing structure, wherein: the routing structure includes a plurality of lines programmably interconnected via one or more configurable circuit elements; each configurable circuit element is adapted to be controlled by one or more memory cells; and at least one of the memory cells is coupled to refresh circuitry adapted to refresh information stored in said memory cell.

According to another embodiment, the present invention is a method of configuring a programmable routing structure in a PLD, the method comprising: reading information to or writing information from memory cells of an apparatus; and refreshing information stored in at least one of the memory cells, wherein the PLD comprises a plurality of configurable logic blocks (CLBs) inter-connectable through the programmable routing structure, wherein: the routing structure includes a plurality of lines programmably interconnected via one or more configurable circuit elements; each configurable circuit element is adapted to be controlled by one or more of the memory cells; and the at least one of the memory cells is coupled to refresh circuitry adapted to refresh information stored in said memory cell.

BRIEF DESCRIPTION OF THE DRAWINGS

Other aspects, features, and benefits of the present invention will become more fully apparent from the following detailed description, the appended claims, and the accompanying drawings in which:

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 2:
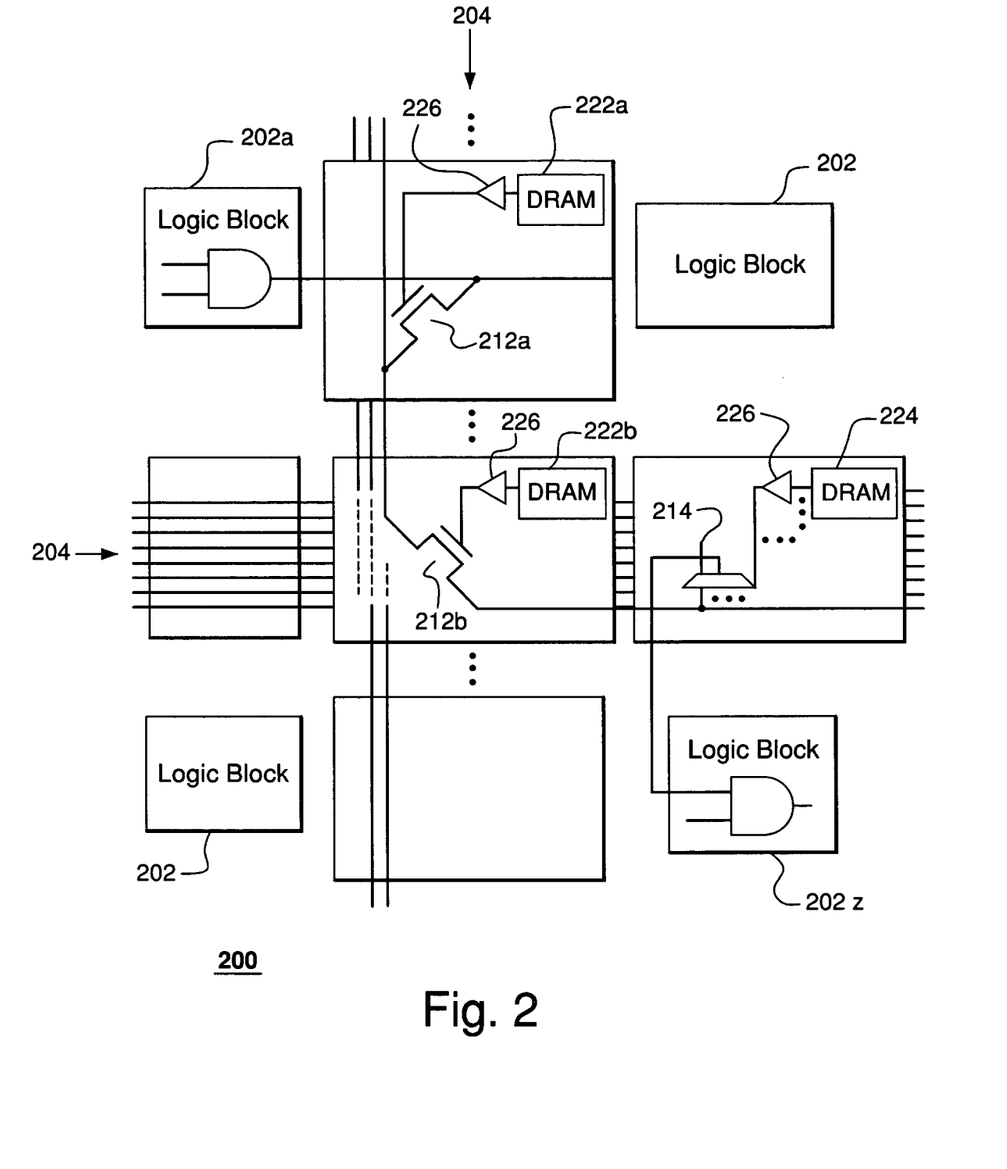
FIG. 2 schematically shows an FPGA having DRAM blocks according to one embodiment of the invention.

FIG. 2 schematically shows an FPGA 200 according to one embodiment of the invention. Similar to FPGA 100 (FIG. 1), FPGA 200 has a plurality of CLBs 202 interconnected through a programmable routing structure 204. However, one difference between FPGA 100 and FPGA 200 is that, instead of SRAM blocks 122 and 124 in the former, the latter employs dynamic random access memory (DRAM) blocks 222 and 224, respectively. In addition, a buffer 226 is coupled between the output of each memory cell of a DRAM block and the corresponding configurable circuit element of routing structure 204. More details on the structure, operation, and advantages of DRAM blocks 222/224 and buffers 226 are provided below.

FIG. 2 illustratively shows that FPGA 200 has a programmable connection between an AND gate in CLB 202a and an AND gate in CLB 202z via two pass-transistors 212a and 212b and a MUX 214. The gate nodes of pass-transistors 212a and 212b are controlled by memory cells in DRAM blocks 222a and 222b, respectively, each DRAM block connected to the corresponding gate node via the corresponding buffer 226. Similarly, each select line of MUX 214 is controlled by a memory cell of DRAM block 224 connected to MUX 214 via buffer 226.

In one embodiment, each buffer 226 is a non-inverting buffer. More specifically, when a signal corresponding to the binary "one" is applied to the non-inverting buffer, the buffer outputs a signal also corresponding to the binary "one". Similarly, when a signal corresponding to the binary "zero" is applied to the non-inverting buffer, the buffer outputs a signal also corresponding to the binary "zero". Thus, when a memory cell in DRAM block 222 has a binary "one", the corresponding pass-transistor 212 receives, from buffer 226, a signal corresponding to the binary "one" and is turned into an "on" state, thereby electrically connecting the lines of routing structure 204 coupled to the source and drain of that pass-transistor. Alternatively, when that memory cell in DRAM block 222 has a binary "zero", pass-transistor 212 receives, from buffer 226, a signal corresponding to the binary "zero" and is turned into an "off" state, thereby electrically isolating those lines. Similarly, when the memory cells in DRAM block 224 have a specific appropriate binary value, that binary value is preserved by buffer(s) 226 and applied to MUX 214, which selects its input line connected to pass-transistor 212b, thereby electrically connecting that pass-transistor to the AND gate in CLB 202z. Alternatively, when those memory cell in DRAM block 224 have a different binary value, that value is also preserved by buffer(s) 226 and applied to MUX 214, which selects a different input line, thereby electrically isolating pass-transistor 212b from the AND gate.

In another embodiment, each buffer 226 is an inverting buffer. More specifically, when a signal corresponding to the binary "one" is applied to the inverting buffer, the buffer outputs a signal corresponding to the binary "zero". Similarly, when a signal corresponding to the binary "zero" is applied to the inverting buffer, the buffer outputs a signal corresponding to the binary "one". This data inversion in buffers 226 is taken into account when DRAM blocks 222 and 224 are programmed such that an inverted version of the data compared to that employed with non-inverting buffers 226 is written into the DRAM blocks. As a result, the two inversions (one in the written data and the other in the inverting buffer) cancel each other, thereby providing circuit connections as described above for the embodiment having non-inverting buffers 226.

One skilled in the art will appreciate that, in a different embodiment, a combination of inverting and non-inverting buffers 226 can be employed in FPGA 200. To program routing structure 204 in said embodiment, the data written into DRAM blocks 222 and 224 are adjusted accordingly to take into account whether or not data inversion is performed in the corresponding buffers 226.

Figure 3:
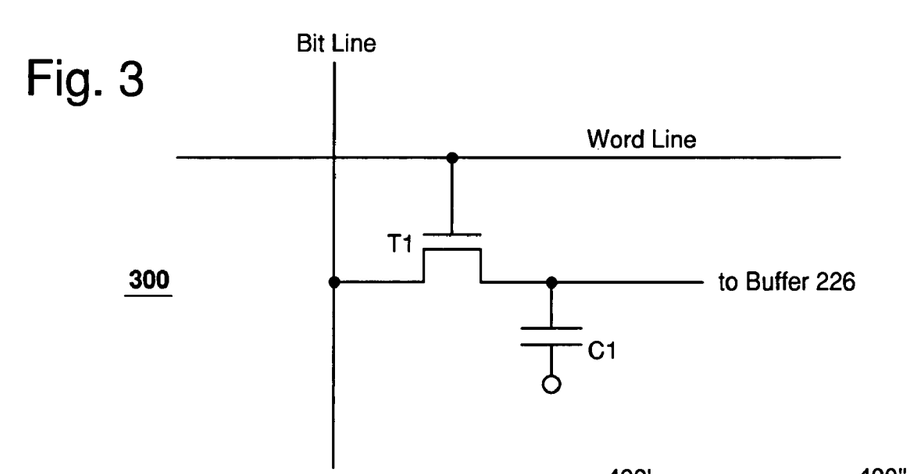
FIG. 3 schematically shows a memory cell that can be used in the DRAM blocks of the FPGA shown in FIG. 2 according to one embodiment of the invention.

FIG. 3 schematically shows a memory cell 300 that can be used in DRAM blocks 222 and 224 according to one embodiment of the invention. Memory cell 300 has a capacitor C1 and a select transistor T1. Capacitor C1 is used to store electrical charge representative of one bit of information. For example, when the charge stored in capacitor C1 is such that the voltage differential across the capacitor is greater than or equal to a certain specific value, memory cell 300 has a binary "one". Similarly, when the charge stored in capacitor C1 is such that the voltage differential across the capacitor is smaller than the specific value, memory cell 300 has a binary "zero". Transistor T1 is used to selectively access capacitor C1 for reading or writing the stored information. More specifically, depending on the voltage applied to the word line connected to the gate node of transistor T1, the transistor is either in the "on" or "off" state. When transistor T1 is in the "on" state, capacitor C1 is connected to the bit line via the transistor. Alternatively, when transistor T1 is in the "off" state, capacitor C1 is isolated from the bit line by the transistor.

During a read operation, the word line is brought to a "high" level, thereby turning the transistor into the "on" state and causing the voltage of capacitor C1 to appear on the bit line. This, in turn, enables a sense amplifier (not shown) associated with the bit line to sense the voltage level of capacitor C1 and interpret it accordingly. During a write operation, the word line connected to the gate node of transistor T1 is similarly brought to a "high" level, which causes the voltage applied to the bit line by a write/refresh amplifier (not shown) to charge/discharge capacitor C1 to that voltage level, thereby storing the corresponding information bit in the capacitor.

In one embodiment, capacitor C1 has a capacitance value greater than a typical capacitance value associated with an SRAM memory cell. More specifically, capacitor C1 has a capacitance value of at least about 2 fF and, preferably, of about 10 fF.

Figure 4:
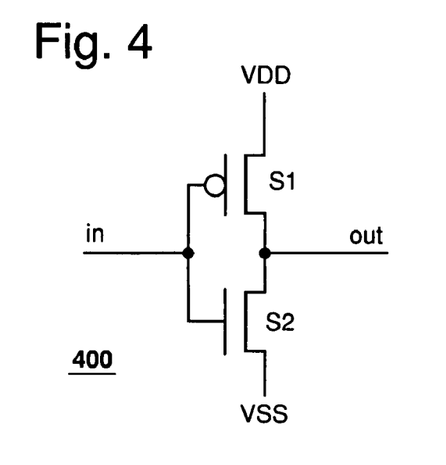
FIG. 4 schematically shows a buffer that can be used in the FPGA shown in FIG. 2 according to one embodiment of the invention.

FIG. 4 schematically shows a buffer 400 that can be used as buffer 226 according to one embodiment of the invention. Buffer 400 has a matched pair of serially connected transistors S1 and S2, the gate nodes of which receive an input signal, e.g., from memory cell 300 (FIG. 3). Transistors S1 and S2 are matched in the sense that, when transistor S1 is in the "on" state, transistor S2 is in the "off" state, and vice versa. Transistors S1 and S2 change their respective states when the input voltage crosses a threshold voltage value typically selected to be about 50% of the power supply voltage differential, VDD−VSS, where VDD and VSS are voltages corresponding to the "high" and "low" terminals, respectively, of the power supply.

When the input voltage applied to buffer 400 is higher than the threshold voltage, which typically corresponds to a binary "one" stored in memory cell 300, transistors S1 and S2 are in the "off" and "on" states, respectively. As a result, buffer 400 connects its output terminal via transistor S2 to the VSS (e.g., ground) terminal of the power supply, thereby causing the buffer to output a signal corresponding to a binary "zero". Similarly, when the input voltage is lower than the threshold voltage, which typically corresponds to a binary "zero" stored in memory cell 300, transistors S1 and S2 are in the "on" and "off" states, respectively. As a result, buffer 400 connects its output terminal via transistor S1 to the VDD terminal of the power supply, thereby causing the buffer to output a signal corresponding to a binary "one". In either situation, buffer 400 inverts the information bit and, as such, is an inverting buffer.

In addition to performing an inversion operation, buffer 400 is adapted to stabilize the output voltage of memory cell 300. For example, when the output voltage level of capacitor C1 (FIG. 3) equals any value between the threshold voltage and VDD, buffer 400 generates a signal level substantially equal to VSS. Similarly, when the output voltage level of capacitor C1 (FIG. 3) equals any value between VSS and the threshold voltage, buffer 400 generates a signal level substantially equal to VDD. As a result, buffer 400 isolates fluctuations in the output voltage of memory cell 300 that do not cross the threshold voltage from the pass-transistors and MUXes.

Figure 5:
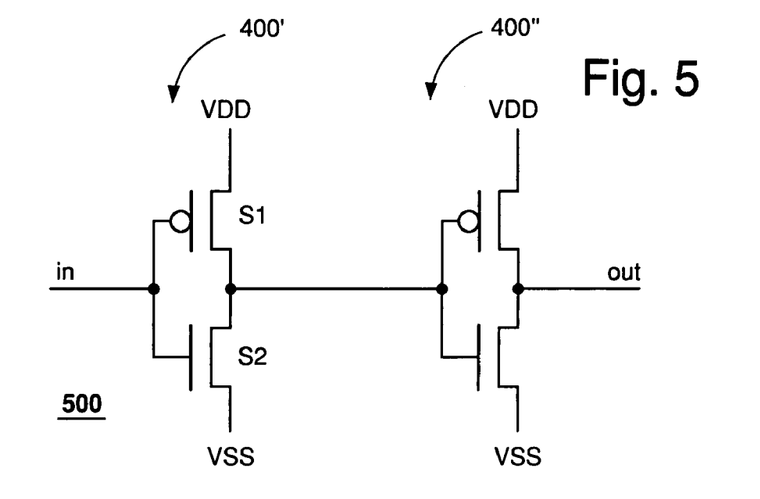
FIG. 5 schematically shows a buffer that can be used in the FPGA shown in FIG. 2 according to another embodiment of the invention.

FIG. 5 schematically shows a buffer 500 that can be used as buffer 226 according to another embodiment of the invention. Buffer 500 has two serially connected buffers 400 labeled 400' and 400" in FIG. 5. Since each of buffers 400 performs a data inversion, the two inversions substantially cancel each other and cause buffer 500 to preserve the information bit applied to the buffer. As such, buffer 500 is a non-inverting buffer.

Advantageously, a relatively large capacitance associated with a memory cell in DRAM blocks 222/224 of FPGA 200 makes that memory cell less susceptible to a state change due to the presence of electrical charge generated during an alpha-particle strike than a prior-art SRAM memory cell. This property provides improved stability of FPGA 200 with respect to soft errors. In addition, in FPGA 200, the capacitance corresponding to the gate nodes of transistors S1 and S2 in buffer 400 (FIG. 4) or buffer 500 (FIG. 5) is substantially added to that of capacitor C1 (FIG. 3), thereby increasing the effective capacitance of the memory cell. The increased capacitance, in turn, further improves the stability of memory cells in FPGA 200 with respect to soft errors. Furthermore, compared to the prior-art solution of performing frequent memory reads, which correct soft errors after they have already occurred, utilization of DRAM blocks is a preventive measure, which deters a substantial portion of potential soft-error triggering events from causing the soft errors in the first place. This property significantly reduces the potential length of time during which FPGA 200 might in fact be affected by soft errors compared to that for FPGA 100. For example, FPGA 200 having memory cells 300 with C1 of about 10 fF has a soft-error rate of better than 500 FIT/Mbit.

While prior-art SRAM memory cells can substantially hold data for as long as the power is on, the same is not true for DRAM memory cells. More specifically, a refresh operation is required to hold data in a DRAM memory cell analogous to memory cell 300. This property of DRAM memory cells is inherently related to the fact that the information is stored in terms of the electrical charge of the cell capacitor, e.g., capacitor C1 (FIG. 3). Since the electrical charge is subjected to inevitable leakage across semiconductor junctions, it is necessary to perform a periodic refresh operation in each memory cell, so as to periodically restore the prescribed electrical charge of the capacitor. The following description discloses refresh circuitry and a corresponding refresh method that enable a refresh operation to be performed in the background, without perturbing the user functions of the FPGA. In essence, the refresh operation is invisible to the user, hence the term "transparent refresh."

Figure 6:
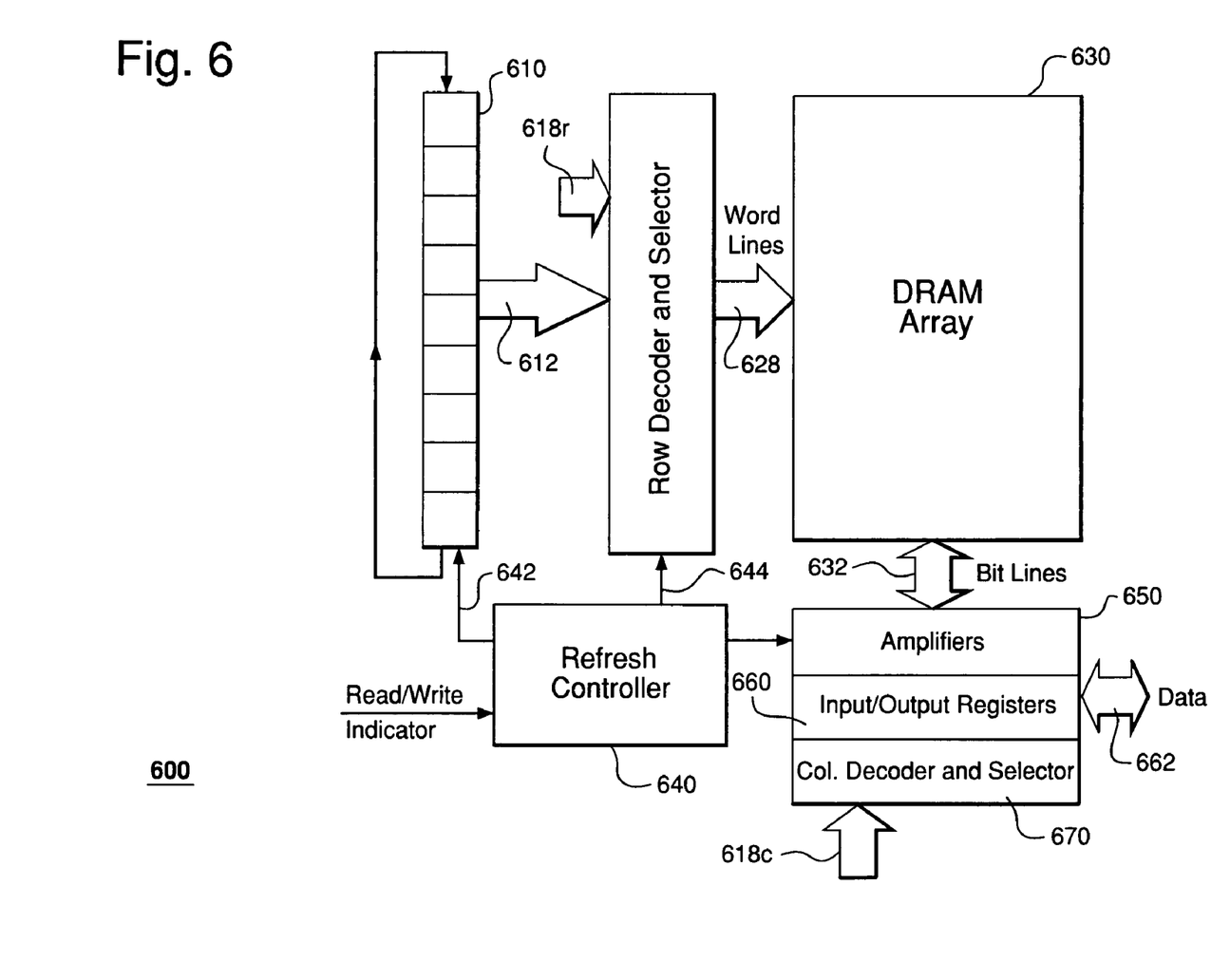
FIG. 6 shows a block diagram of a DRAM block that can be used in the FPGA shown in FIG. 2 according to one embodiment of the invention.

FIG. 6 shows a block diagram of a DRAM block 600 that can be used in FPGA 200 according to one embodiment of the invention. DRAM block 600 has a DRAM array 630 of memory cells, each cell analogous to memory cell 300 (FIG. 3). Buses 628 and 632 coupled to DRAM array 630 have word and bit lines, respectively, for the array's memory cells (see also FIG. 3).

In one embodiment, memory cells in DRAM array 630 are arranged in rows and columns. Address signals 618r and 618c provide the row and column addresses, respectively, of the memory cell that needs to be accessed during a read or write operation. To read data from the memory cell identified by the address signals, a row decoder and selector (RDS) circuit 620 calculates, from signal 618r, the row number and activates the corresponding word line of bus 628. The activated word line turns on the select transistors, e.g., transistors T1 (FIG. 3), for all memory cells in the selected row. This enables each sense amplifier of an amplifier bank 650 associated with a column of DRAM array 630 to sense the voltage level on the corresponding bit line of bus 632 and interpret that level accordingly as either a binary "zero" or a binary "one".

A column decoder and selector (CDS) circuit 670 calculates, from signal 618c, the column number and selects the output of the sense amplifier corresponding to that column. A corresponding register of input/output (I/O) registers 660 then receives the corresponding data bit from the selected output and applies it to a data bus 662 that outputs the data bit from DRAM block 600. Since, during a read operation, transistors T1 in the entire selected row of memory cells are turned on, refresh amplifiers of amplifier bank 650 can be activated to rewrite (refresh) the stored information by restoring the appropriate voltages onto the cell capacitors.

To write data into the memory cell identified by address signals 618r and 618c, RDS circuit 620 similarly activates the corresponding word line of bus 628 and CDS circuit 670 similarly selects the refresh amplifier corresponding to the selected column. However, instead of refreshing the data bit in the selected memory cell, the refresh amplifier writes a new data bit received by the corresponding register of I/O registers 660 via data bus 662. Note that only the data bit stored in the selected memory cell is replaced with a new data bit. At the same time, the data bits stored in all other memory cells of the selected row can be refreshed in a manner similar to that of a read operation.

Amplifier bank 650 has (i) a plurality of sense amplifiers, with at least one sense amplifier coupled to each bit line, and (ii) a plurality of write/refresh amplifiers, with at least one write/refresh amplifier coupled to each bit line. Design and implementation of sense and write/refresh amplifiers are well known to one of ordinary skill in the art.

It is clear from the above description that the information stored in the selected row of DRAM array 630 can be refreshed during each read or write operation. However, in FPGAs analogous to FPGA 200, read and write operations are typically performed relatively infrequently and might not be able to satisfy the refresh requirements for DRAM block 600. To address this problem, special refresh circuitry comprising a cyclical shift register 610 and a refresh controller 640 can be incorporated into DRAM block 600.

In one embodiment, cyclical shift register 610 has a number of cells equal to the number of rows in DRAM array 630, thereby establishing a one-to-one correspondence between cell addresses in the cyclical shift register and row addresses in the DRAM array. In a representative configuration, one cell of cyclical shift register 610 has a binary "one" while each of the remaining cells has a binary "zero". The binary "one" is periodically shifted from a present cell to the next cell of cyclical shift register 610 based on a control signal 642 generated by refresh controller 640. More specifically, when a read or write operation is being currently performed in DRAM array 630, refresh controller 640 configures cyclical shift register 610 to hold the binary "one" at its present location in the register. Alternatively, when no read or write operation is being performed in DRAM array 630, refresh controller 640 configures cyclical shift register 610 to periodically shift the binary "one" to the next cell of the register.

An address signal 612 generated by cyclical shift register 610 indicates the present location (cell address) of the binary "one" in the shift register. Address signal 612 is applied to RDS circuit 620 and, using the one-to-one correspondence between cell addresses in cyclical shift register 610 and row addresses in DRAM array 630, is interpreted by the RDS circuit as a row address. As such, RDS circuit 620 receives two different row-address signals 612 and 618r. However, based on a select signal 644 generated by refresh controller 640, RDS circuit 620 selects only one of these row-address signals. More specifically, when a read or write request is received by DRAM block 600, refresh controller 640 configures RDS circuit 620 to select address signal 618r. As a result, DRAM block 600 proceeds to perform a read or write operation as described above. Alternatively, when there are no read or write requests, refresh controller 640 configures RDS circuit 620 to select address signal 612.

When address signal 612 is selected, DRAM block 600 performs a refresh operation as follows. Based on address signal 612, RDS circuit 620 activates the corresponding word line of bus 628. The activated word line turns on the select transistors for all memory cells in the corresponding row, which enables the corresponding sense amplifiers of amplifier bank 650 to sense the voltage levels on the corresponding bit lines of bus 632 and interpret those levels accordingly. The refresh amplifiers of amplifier bank 650 are then activated to recharge the memory cell capacitors in accordance with this data interpretation, thereby refreshing the information stored in the entire row selected by address signal 612. Refresh controller 640 subsequently instructs cyclical shift register 610, via control signal 642, to shift the binary "one" to the next cell.

To summarize, when there are no read or write requests, refresh controller 640 configures cyclical shift register 610, RDS circuit 620, and amplifier bank 650 to refresh information stored in DRAM array 630 in a cyclical manner, row by row. When a read/write request is received by DRAM block 600, the cyclical refresh operation is suspended to enable unimpeded access to the memory cells of DRAM array 630, but the refresh operation associated with the read/write operation is performed, e.g., as described above, on all memory cells in the selected row, except for the memory cell being read from or written to. The cyclical refresh operation is resumed after the read/write operation is completed.

Figure 7:
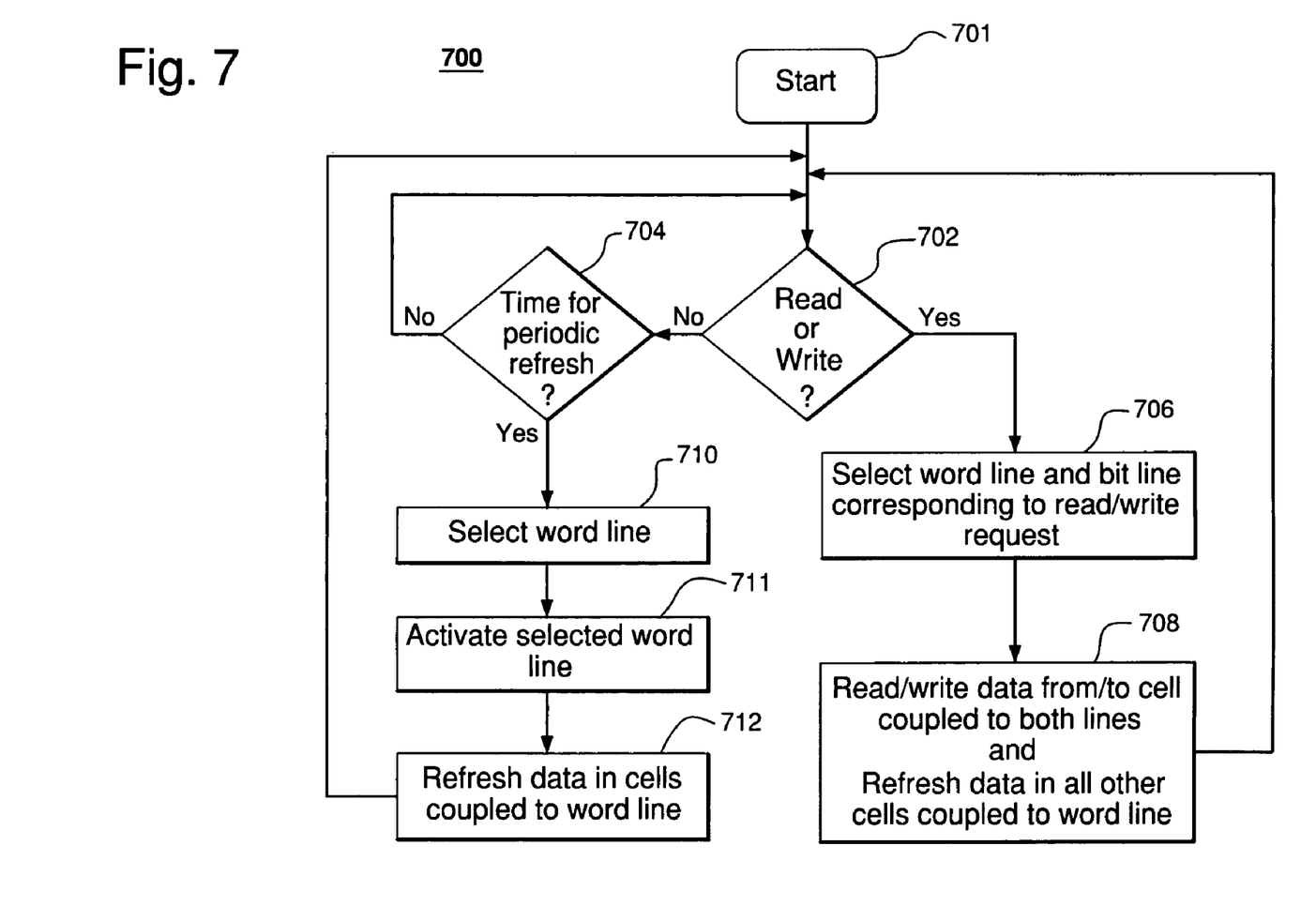
FIG. 7 shows a flowchart of a method of transparent data refresh that can be implemented in the FPGA shown in FIG. 2 according to one embodiment of the invention.

FIG. 7 shows a flowchart of a method 700 of refreshing information that can be implemented in FPGA 200 according to one embodiment of the invention. Method 700 is applicable to DRAM blocks having memory cells arranged in a logical rectangular array (e.g., as shown in FIG. 6). Advantageously, method 700 enables a transparent refresh operation that does not substantially interfere with the user functions of the FPGA.

Method 700 starts at process block 701, which may correspond, for example, to the power being turned on in the PLD. In process block 702, which follows process block 701, it is determined whether there is a data read or write request. For example, in FPGA 200, read and/or write operations are typically performed when routing structure 204 is programmed and/or when the configuration data are read back for troubleshooting or verification purposes. When a read/write request is present, the processing of method 700 proceeds to process blocks 706 and 708. Otherwise, the processing proceeds to process block 704, in which it is determined whether or not a certain predetermined amount of time has passed after the previous refresh operation (if any). If that amount of time has passed, the processing is directed to process blocks 710, 711, and 712. Otherwise, the processing is directed back to process block 702.

In process block 706, a word line and a bit line corresponding to the read/write request are selected. For example, in DRAM block 600, a word line in bus 628 and a bit line in bus 632 are selected based on address signals 618r and 618c, respectively, as explained above in the context of FIG. 6.

In process block 708, which follows process block 706, a data bit is read from or written to the memory cell that is coupled to the selected word and bit lines. As already explained in the context of FIG. 6, a read operation is performed such that the data bit is refreshed in the memory cell coupled to the selected word and bit lines. A write operation implies that the capacitor of the memory cell coupled to the selected word and bit lines is charged to a level similar to that attained during a refresh operation. In addition, in process block 708, data bits in all other memory cells coupled to the selected word line are refreshed. The processing of method 700 then returns back to process block 702.

In process block 710, a word line corresponding to a refresh operation that is carried out in the background is selected. For example, in DRAM block 600, a word line in bus 628 is selected based on address signal 612, which is generated by cyclical shift register 610 as explained above in the context of FIG. 6. Alternatively, to implement process block 710, a DRAM block analogous to DRAM block 600 may have a processor that, for each word line, keeps track of the time elapsed since the word line was selected in prior instances of process block 706 and process block 710. The processor then configures the DRAM block to select the word line corresponding to, for example, the longest elapsed time. In principle, the processor may employ any suitable algorithm of word-line selection that prevents the information stored in the DRAM block from being lost due to the capacitor discharge. In process block 711, which follows process block 710, the selected word line is activated, e.g., to turn on select transistors T1 (FIG. 3) connected to that word line.

In process block 712, which follows process block 711, information stored in all memory cells coupled to the activated word line is refreshed, e.g., as described above for DRAM block 600. The processing of method 700 then returns back to process block 702.

While this invention has been described with reference to illustrative embodiments, this description is not intended to be construed in a limiting sense. Although the present invention was described in reference to FPGAs, it may be applied to different PLD architectures and implementation technologies, as well as PLDs other than FPGAs, such as Field-Programmable Logic Arrays (PLAs), Simple Programmable Logic Devices (SPLDs), Complex Programmable Logic Devices (CPLDs). Although the present invention was described in reference to devices having the DRAM cells of FIG. 3, it may similarly be practiced with devices having other non-static memory cells, such as pseudo-static DRAM (PSRAM) cells and/or virtual static DRAM (VS-RAM) cells, wherein the term "a non-static memory cell" refers to any memory cell that needs, from time to time, to be replenished to prevent loss of information resulting from decay/dissipation processes associated with the cell structure. Although certain embodiments of the invention were described as having rectangular DRAM arrays, e.g., DRAM array 630 (FIG. 6), the invention is not so limited and can be practiced with distributed DRAM arrays and/or logical rectangular DRAM arrays.

Although the acts in the following method claims, if any, are recited in a particular sequence with corresponding labeling, unless the claim recitations otherwise imply a particular sequence for implementing some or all of those acts, those acts are not necessarily intended to be limited to being implemented in that particular sequence.

What is claimed is:

1. A programmable logic device (PLD), comprising a plurality of configurable logic blocks (CLBs) inter-connectable through a programmable routing structure, wherein:
   the routing structure includes a plurality of lines programmably interconnected via one or more configurable circuit elements;
   each configurable circuit element is adapted to be controlled by one or more memory cells;
   at least one of the memory cells is coupled to (i) refresh circuitry adapted to refresh information stored in said memory cell and (ii) a corresponding configurable circuit element via a buffer adapted to isolate voltage fluctuations in the at least one memory cell from the configurable circuit element;
   two or more of the memory cells are organized in one or more rows and one or more columns, wherein each of said two or more of the memory cells is coupled to a word line and a bit line; and
   the refresh circuitry comprises:
      a selector circuit coupled to the two or more of the memory cells via one or more word lines, said selector circuit adapted to receive a first row-address signal; and
      a bank of amplifiers coupled to the two or more of the memory cells via one or more bit lines, wherein, for each bit line, the bank of amplifiers is adapted to (A) sense a voltage level on the bit line and (B) apply a write or refresh voltage to the bit line.

2. The invention of claim 1, wherein the at least one memory cell is a dynamic random access memory (DRAM) cell.

3. The invention of claim 1, wherein:
   the PLD is a field-programmable gate array (FPGA); and
   the one or more configurable circuit elements comprise at least one of one or more pass transistors and one or more multiplexers.

4. The invention of claim 1, wherein the isolated voltage fluctuations are voltage fluctuations that do not cross a threshold voltage.

5. The invention of claim 4, wherein the buffer converts a voltage stored in the at least one memory cell into a voltage corresponding to one of power supply voltages.

6. The invention of claim 1, wherein the buffer comprises a first matched pair of serially connected transistors, wherein:
   each transistor of the matched pair has a gate node; and
   the gate nodes of the transistors are connected together and coupled to the first memory cell.

7. The invention of claim 6, wherein:
   the memory cell comprises a capacitor coupled to a bit line via a select transistor, wherein:
      the select transistor is adapted to be controlled by a voltage applied to a corresponding word line; and
      the word and bit lines are coupled to the refresh circuitry; and
   capacitance of the memory cell is greater than about 2 fF.

8. The invention of claim 6, wherein:
   the buffer further comprises a second pair of matched transistors;
   the gate nodes of the transistors in the second matched pair are connected together and coupled to the first matched pair; and
   the buffer is a non-inverting buffer.

9. The invention of claim 6, wherein the total capacitance associated with the memory cell is a function of the gate capacitance of the buffer.

10. The invention of claim 1, wherein the refresh circuitry further comprises:
    a cyclical shift register adapted to generate a second row-address signal applied to the selector circuit; and
    a refresh controller adapted to generate control signals for the bank of amplifiers, the selector circuit, and the cyclical shift register.

11. The invention of claim 10, wherein:
    the first row-address signal corresponds to a read or write operation;
    the second row-address signal corresponds to a refresh operation; and
    the selector circuit is adapted to:
       select one of the row-address signals based on a first control signal generated by the refresh controller; and activate a word line corresponding to the selected row-address signal.

12. The invention of claim 11, wherein:
when the first row-address signal is selected, the refresh controller configures the bank of amplifiers to:
(i) read information from or write information to a memory cell identified by the first row-address signal and by a column address signal, wherein the column address signal corresponds to the read or write operation in the DRAM array; and
(ii) refresh information in other memory cells of the row identified by the first row-address signal; and
when the second row-address signal is selected, the refresh controller configures the bank of amplifiers to refresh information in all memory cells of the row identified by the second row-address signal.

13. The invention of claim 11, wherein:
the second row-address signal is generated based on a pattern of information bits stored in the cyclical shift register; and
the cyclical shift register is adapted to shift said pattern along the register based on a second control signal generated by the refresh controller.

14. The invention of claim 13, wherein:
when the first row-address signal is selected, the refresh controller instructs the cyclical shift register to hold the pattern at a present position; and
when the second row-address signal is selected, the refresh controller instructs the cyclical shift register to periodically shift the pattern along the register.

15. A method of configuring a programmable routing structure in a PLD, the method comprising:
reading information to or writing information from memory cells of an apparatus;
refreshing information stored in at least one of the memory cells, wherein:
the PLD comprises a plurality of configurable logic blocks (CLBs) inter-connectable through the programmable routing structure, wherein:
the routing structure includes a plurality of lines programmably interconnected via one or more configurable circuit elements;
each configurable circuit element is adapted to be controlled by one or more of the memory cells; and
the at least one of the memory cells is coupled to (i) refresh circuitry adapted to refresh information stored in said memory cell and (ii) a corresponding configurable circuit element via a buffer adapted to isolate voltage fluctuations in the at least one memory cell from the configurable circuit element;
refreshing in a periodic manner, the information stored in the at least one of the memory cells;
temporarily suspending the periodic refresh to perform the reading or writing; and
resuming the periodic refresh when the reading or writing is completed, wherein:
two or more of the memory cells are organized in one or more rows and one or more columns, wherein each of said two or more of the memory cell is coupled to a word line and a bit line; and
the refresh circuitry comprises:
a selector circuit coupled to the two or more of the memory cells via one or more word lines, said selector circuit adapted to receive a first row-address signal; and
a bank of amplifiers coupled to the two or more of the memory cells via one or more bit lines, wherein, for each bit line, the bank of amplifiers is adapted to (A) sense a voltage level on the bit line and (B) apply a write or refresh voltage to the bit line.

16. The invention of claim 15, wherein at least one of the memory cells is a dynamic random access memory (DRAM) cell.

17. The invention of claim 15, wherein the buffer is a non-inverting buffer.

18. A programmable logic device (PLD), comprising a plurality of configurable logic blocks (CLBs) and a plurality of memory cells, wherein:
each CLB is adapted to be configured using one or more memory cells;
at least one of the memory cells is coupled to (i) refresh circuitry adapted to refresh information stored in said memory cell and (ii) a corresponding CLB via a buffer adapted to isolate voltage fluctuations in the at least one memory cell from the CLB;
the buffer comprises a first matched pair of serially connected transistors, wherein:
each transistor of the matched pair has a gate node; and
the gate nodes of the transistors are connected together and coupled to the first memory cell; and
the buffer further comprises a second pair of matched transistors, wherein the gate nodes of the transistors in the second matched pair are connected together and coupled to the first matched pair.

19. A programmable logic device (PLD), comprising a plurality of configurable logic blocks (CLBs) inter-connectable through a programmable routing structure, wherein:
the routing structure includes a plurality of lines programmably interconnected via one or more configurable circuit elements;
each configurable circuit element is adapted to be controlled by one or more memory cells; and
at least one of the memory cells is coupled to (i) refresh circuitry adapted to refresh information stored in said memory cell and (ii) a corresponding configurable circuit element via a buffer adapted to isolate voltage fluctuations in the at least one memory cell from the configurable circuit element;
the buffer comprises a first matched pair of serially connected transistors, wherein:
each transistor of the matched pair has a gate node; and
the gate nodes of the transistors are connected together and coupled to the first memory cell;
the buffer further comprises a second pair of matched transistors;
the gate nodes of the transistors in the second matched pair are connected together and coupled to the first matched pair; and
the buffer is a non-inverting buffer.

* * * * *